United States Patent
Yan et al.

(10) Patent No.: US 8,659,892 B2
(45) Date of Patent: Feb. 25, 2014

(54) ELECTRONIC DEVICE WITH HEAT PIPE CHAMBER COVER FOR DISSIPATING HEAT

(75) Inventors: Qing-Ping Yan, Shenzhen (CN); De-Yu Wang, Shenzhen (CN); Jiang-Jun Hu, Shenzhen (CN); Chuen-Shu Hou, New Taipei (TW)

(73) Assignees: Fu Zhun Precision Industry (Shen Zhen) Co., Ltd., Shenzhen (CN); Foxconn Technology Co., Ltd., New Taipei (TW)

( * ) Notice: Subject to any disclaimer, the term of this patent is extended or adjusted under 35 U.S.C. 154(b) by 297 days.

(21) Appl. No.: 13/204,727

(22) Filed: Aug. 8, 2011

(65) Prior Publication Data

US 2012/0307453 A1    Dec. 6, 2012

(30) Foreign Application Priority Data

May 31, 2011    (CN) .......................... 2011 1 0144378

(51) Int. Cl.
*H05K 7/20* (2006.01)
(52) U.S. Cl.
USPC ............... 361/679.52; 361/679.47; 361/700; 361/702; 361/707; 165/104.33
(58) Field of Classification Search
USPC .................. 361/679.46–679.54, 688–722
See application file for complete search history.

(56) References Cited

U.S. PATENT DOCUMENTS

| | | | | |
|---|---|---|---|---|
| 5,880,524 | A * | 3/1999 | Xie | 257/704 |
| 6,082,443 | A * | 7/2000 | Yamamoto et al. | 165/104.26 |
| 6,178,088 | B1 * | 1/2001 | Gates | 361/699 |
| 6,901,994 | B1 * | 6/2005 | Jin-Cherng et al. | 165/104.26 |
| 7,515,415 | B2 * | 4/2009 | Monfarad et al. | 361/699 |
| 7,551,442 | B2 * | 6/2009 | Stefanoski | 361/700 |
| 2007/0091548 | A1 * | 4/2007 | Voisine | 361/663 |
| 2010/0254090 | A1 | 10/2010 | Trautman | |
| 2013/0128461 | A1 * | 5/2013 | Nagasawa | 361/704 |

FOREIGN PATENT DOCUMENTS

| CN | 201797688 U | 4/2011 |
|---|---|---|
| TW | 200907273 A | 2/2009 |

* cited by examiner

*Primary Examiner* — Courtney Smith
(74) *Attorney, Agent, or Firm* — Altis Law Group, Inc.

(57) ABSTRACT

An exemplary electronic device includes a base, a cover, side plates, a heat conduct plate, a wick structure, a working medium and at least one electronic element. The cover and the base cooperatively define a cavity. The at least one side plate extends from the cover and receives in the cavity. The heat conduct plate and the at least side plate and the cover cooperatively defines a sealed chamber. The wick structure is attached to an inner surface of the sealed chamber. The working medium is received in the wick structure. The at least one electronic element is received in the cavity and thermally connected to the heat conduct plate.

11 Claims, 2 Drawing Sheets

ELECTRONIC DEVICE WITH HEAT PIPE CHAMBER COVER FOR DISSIPATING HEAT

BACKGROUND

1. Technical Field

The present disclosure relates to electronic devices and, more particularly, to an electronic device using a plate type heat pipe.

2. Description of Related Art

Nowadays, numerous types of heat pipes are used to dissipate heat generated by electronic devices. A typical plate heat pipe is a hollow tube receiving working medium therein, and has a wick structure formed on an inner face thereof for drawing back the working medium. The heat pipe is maintained in thermal contact with a shell of an electronic device to dissipate heat generated from the electronic device. However, thermal resistance between the heat pipe and the shell may be significant, and reduces the heat dissipation efficiency of the heat pipe.

Therefore, what is needed is an electronic device which can overcome the above described shortcomings.

DETAILED DESCRIPTION

Figure 1:
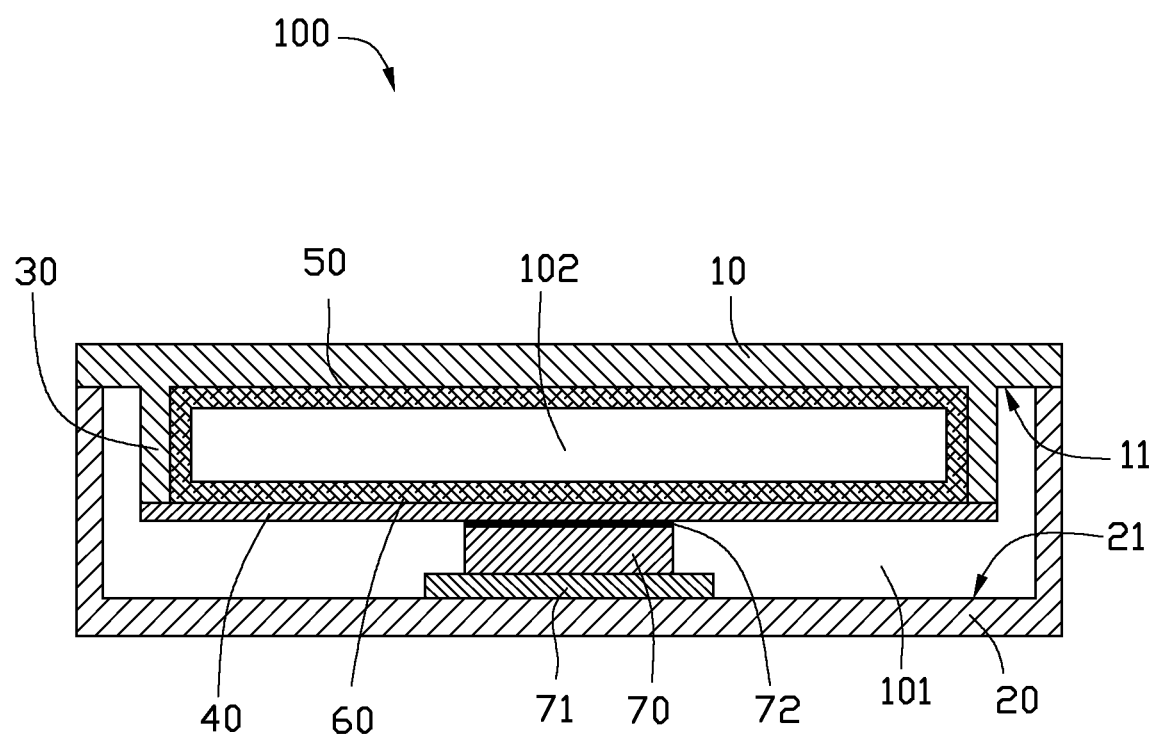
FIG. 1 is a cross-sectional view of an electronic device in accordance with a first embodiment of the present disclosure.

Referring to FIG. 1, an electronic device 100 according to a first embodiment of the present disclosure is shown. The electronic device 100 can be a portable DVD (Digital Video Disc) player, a notebook computer, a mobile phone or a projector. The electronic device 100 includes a cover 10, a base 20 engaged with the cover 10, a plurality of side plates 30, a heat conduct plate 40, a wick structure 50, a working medium 60, and an electronic element 70.

The cover 10 is an elongated plate, and includes a planar bottom surface 11. The base 20 has an approximately U-shaped configuration. The cover 10 and the base 20 cooperatively define a cavity 101. The cavity 101 is used to receive the electronic element 70 and other electronic elements of the electronic device 100. The base 20 includes a top surface 21 opposite to the bottom surface 11 of the cover 10. The cover 10 and the base 20 are made of metal with good heat dissipation efficiency. The cover 10 and the base 20 can cooperatively form a shell of the electronic device 100.

The side plates 30 are received in the cavity 101, and extend from the bottom surface 11 of the cover 10. In the present embodiment, there are four side plates 30, which extend perpendicularly down from a periphery of the bottom surface 11. The side plates 30 and the cover 10 are integrally formed as a single monolithic piece of the same material, namely metal. In other words, the side plates 30 and the cover 10 are portions of a single body formed from the same metallic material.

The heat conduct plate 40 is an elongated plate and coupled to free ends of the side plates 11. The heat conduct plate 40, the side plates 30 and the heat conduct plate 40 cooperatively define a sealed chamber 102. The sealed chamber 102 is elongated and has a flattened shape. That is, the sealed chamber 102 has a low profile. The heat conduct plate 40 is soldered to the side plates 30.

The wick structure 50 is attached to an inner surface of the sealed chamber 102. The wick structure 50 is flattened. The wick structure 50 has a porous construction. For example, the wick structure 50 may be in the form of grooves, sintered powder, screen mesh, or bundles of fiber.

The working medium 60 is received in the sealed chamber 102. The electronic element 70 is received in the cavity 101 and thermally connected with the heat conduct plate 40 via a thermally conductive layer 72. In the present embodiment, the electronic element 70 is mounted on the second surface 21 of the base 20 via a printed circuit board (PCB) 71.

In the present embodiment, the heat conduct plate 40, the side plates 30 and the cover 10 cooperatively define a plate heat pipe. The heat conduct plate 40 acts as an evaporation section of the heat pipe, and the cover 10 acts as a condensation section of the heat pipe. The working medium 60 in a liquid state in the evaporation section absorbs heat from the electronic element 70 and vaporizes to the vapor state. The vapor pressure expels the working medium 60 in the vapor state, and the expelled working medium 60 carries heat with it. At the condensation section, the working medium 60 in the vapor state dissipates the heat to the ambient environment and condenses back to the liquid state, and then flows back to the evaporation section to start another heat transfer cycle.

The cover 10 of the electronic device 100 is configured as a shell of the heat pipe; therefore, it can reduce the thermal resistance and improve the heat dissipation efficiency.

Figure 2:
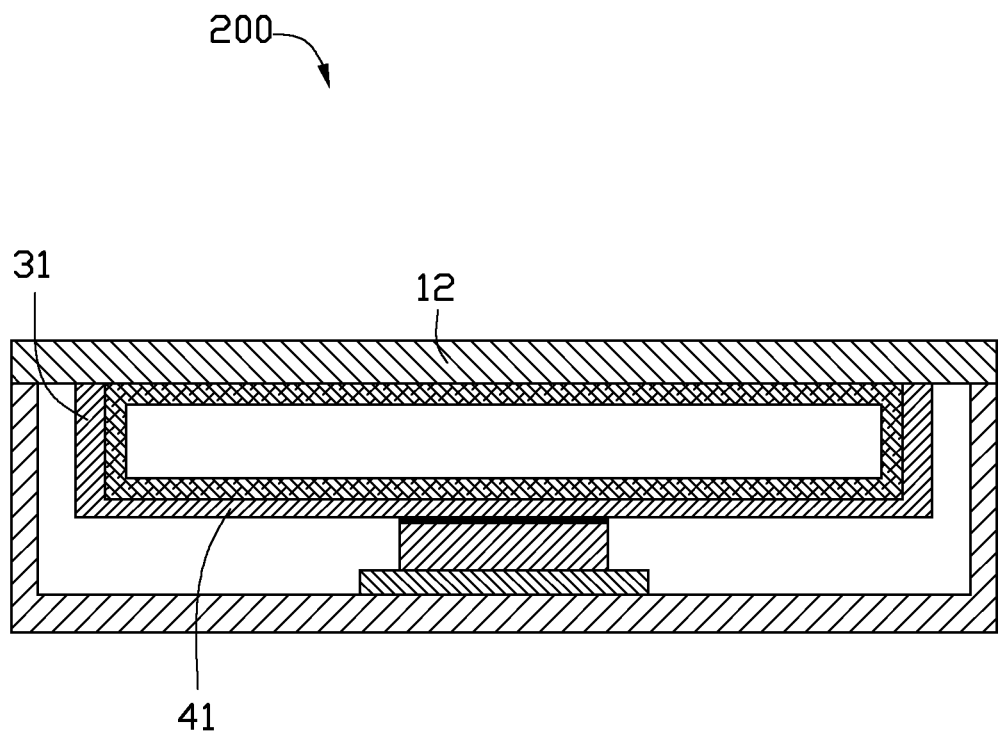
FIG. 2 is a cross-sectional view of an electronic device in accordance with a second embodiment of the present disclosure.

Referring to FIG. 2, an electronic device 200 according to a second embodiment of the present disclosure is shown. Differing from the electronic device 100, the side plates 31 and the heat conduct plate 41 of the electronic device 200 are integrally formed as a single monolithic piece of the same material, namely metal. In other words, the side plates 31 and the heat conduct plate 41 are portions of a single body formed from the same metallic material. The side plates 31 are soldered to the cover 12.

It is to be further understood that even though numerous characteristics and advantages have been set forth in the foregoing description of embodiments, together with details of the structures and functions of the embodiments, the disclosure is illustrative only; and that changes may be made in detail, especially in matters of shape, size, and arrangement of parts within the principles of the disclosure to the full extent indicated by the broad general meaning of the terms in which the appended claims are expressed.

What is claimed is:

1. An electronic device, comprising:
    a base;
    a cover, the cover and the base cooperatively defining a cavity, the base and the cover being made of metal;
    at least one side plate, the at least one side plate extending from the cover and received in the cavity;
    a heat conduct plate, the heat conduct plate, the at least one side plate and the cover cooperatively defining a sealed chamber;
    a wick structure attached to an inner surface of the sealed chamber;
    a working medium being received in the sealed chamber; and
    at least one electronic element, the at least one electronic element received in the cavity and thermally connected to the heat conduct plate, the at least one electronic element is mounted on the base via a printed circuit board.

2. The electronic device of claim 1, wherein the at least one side plate is made of metal.

3. The electronic device of claim 1, wherein the cover and the at least one side plate are integrally formed as a single monolithic piece of metal.

4. The electronic device of claim 1, wherein the heat conduct plate is soldered to the at least one side plate.

5. The electronic device of claim 1, wherein the at least one side plate and the heat conduct plate are integrally formed as a single monolithic piece of metal.

6. The electronic device of claim 5, wherein the at least one side plate is soldered to the cover.

7. The electronic device of claim 1, wherein the cover and the heat conduct plate are elongated plates.

8. The electronic device of claim 1, wherein the cover, the at least one side plate, the heat conduct plate, the wick structure and the working medium cooperatively define a plate heat pipe.

9. The electronic device of claim 1, wherein the at least one side plate extends perpendicularly from a peripheral of the cover.

10. An electronic device, comprising:
a base;
a first cover portion, the first cover portion and the base cooperatively defining a cavity, the base and the first cover being made of metal;
a heat pipe, the heat pipe comprising a second cover portion, a heat conduct plate, a wick structure and a working medium, the second cover portion and the heat conduct plate cooperatively defining a sealed chamber, the wick structure attached to an inner surface of the sealed chamber, the working medium received in the sealed chamber;
at least one electronic element;
wherein the first cover portion and the second cover portion are integrally formed as a single monolithic piece, and the at least one electronic element is received in the cavity and thermally connected to the heat conduct plate, the at least one electronic element is mounted on the base via a printed circuit board.

11. The electronic device of claim 10, wherein the second cover portion and the heat conduct plate are made of metal.

* * * * *